(12) United States Patent
Kudelka et al.

(10) Patent No.: US 7,312,114 B2
(45) Date of Patent: Dec. 25, 2007

(54) MANUFACTURING METHOD FOR A TRENCH CAPACITOR HAVING AN ISOLATION COLLAR ELECTRICALLY CONNECTED WITH A SUBSTRATE ON A SINGLE SIDE VIA A BURIED CONTACT FOR USE IN A SEMICONDUCTOR MEMORY CELL

(75) Inventors: Stephan Kudelka, Dresden (DE); Guenther Aichmayr, Dresden (DE)

(73) Assignee: Infineon Technologies AG, Munich (DE)

( * ) Notice: Subject to any disclaimer, the term of this patent is extended or adjusted under 35 U.S.C. 154(b) by 196 days.

(21) Appl. No.: 11/115,391

(22) Filed: Apr. 27, 2005

(65) Prior Publication Data
US 2006/0246656 A1 Nov. 2, 2006

(51) Int. Cl.
*H01L 21/8242* (2006.01)
(52) U.S. Cl. ............. 438/243; 438/244; 438/386; 438/387; 257/E21.651
(58) Field of Classification Search ............ 438/243, 438/244, 245, 248, 386, 387, 391, 241; 257/301, 257/302, E25.651, E27.092, E27.093, E29.095
See application file for complete search history.

(56) References Cited

U.S. PATENT DOCUMENTS

| 6,828,192 | B2 * | 12/2004 | Gustin et al. ............. 438/249 |
| 6,905,897 | B1 * | 6/2005 | Hsu ......................... 438/18 |
| 7,170,125 | B2 * | 1/2007 | Seidl et al. ............... 257/301 |
| 2005/0020024 | A1 * | 1/2005 | Goldbach ................. 438/386 |
| 2005/0026384 | A1 * | 2/2005 | Kudelka et al. .......... 438/386 |
| 2005/0106831 | A1 * | 5/2005 | Hsu et al. ................. 438/386 |
| 2005/0153507 | A1 * | 7/2005 | Hecht et al. .............. 438/243 |

\* cited by examiner

*Primary Examiner*—Matthew C. Landau
(74) *Attorney, Agent, or Firm*—Eschweiler & Associates, LLC (57) ABSTRACT

The present invention relates to a manufacturing method for a trench capacitor having an isolation collar which is electrically connected with a substrate on a single side via a buried contact. More specifically, the present invention relates to manufacturing method for a trench capacitor having an isolation collar with a metal conductive fill in the collar region connected to a metal fill in the capacitor region.

13 Claims, 13 Drawing Sheets

MANUFACTURING METHOD FOR A TRENCH CAPACITOR HAVING AN ISOLATION COLLAR ELECTRICALLY CONNECTED WITH A SUBSTRATE ON A SINGLE SIDE VIA A BURIED CONTACT FOR USE IN A SEMICONDUCTOR MEMORY CELL

TECHNICAL FIELD OF THE INVENTION

The present invention relates to a manufacturing method for a trench capacitor, and in particular having an isolation collar which is electrically connected with a substrate on a single side via a buried contact for use in a semiconductor memory cell.

BACKGROUND OF THE INVENTION

Although in principle applicable to arbitrary integrated circuits, the following invention and the underlying problems will be explained with respect to integrated memory circuits in silicon technology.

Figure 1:
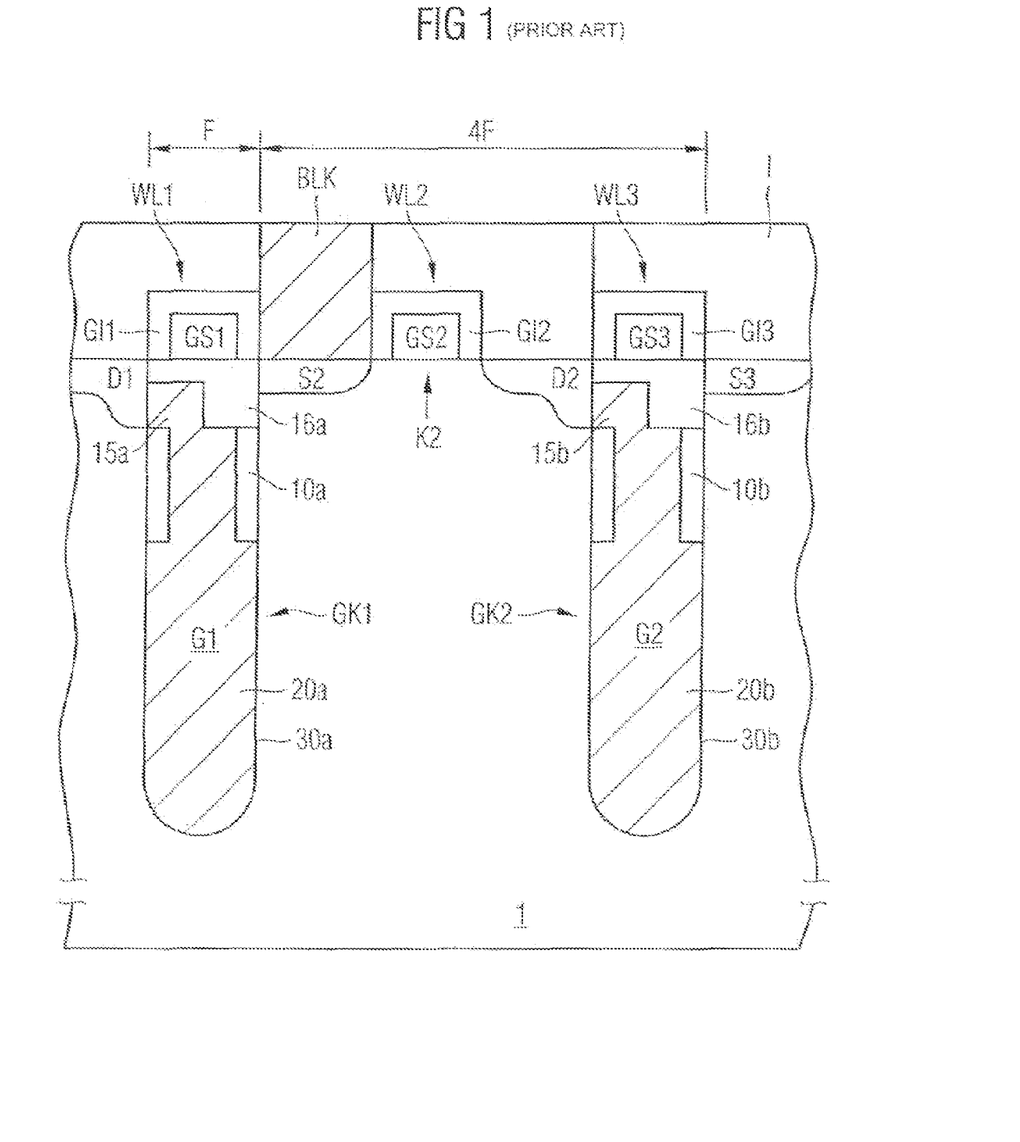
FIG. 1 shows a schematic cross-section of a semiconductor memory cell having a trench capacitor and a planar selection transistor connected thereto.

FIG. 1 shows a schematic cross-section of a semiconductor memory cell having a trench capacitor and a planar selection transistor connected thereto.

In FIG. 1, reference sign 1 denotes a silicon substrate. In the semiconductor substrate 1, trench capacitors GK1, GK2 are provided which include trenches G1, G2, the electrically conductive fillings 20a, 20b thereof forming capacitor electrodes. The conductive fillings 20a, 20b are isolated by a dielectric 30a, 30b with respect to the semiconductor substrate 1 in the lower and medium trench region, said substrate 1 forming the second capacitor electrodes (e.g. in form of a buried plate not shown).

Figure 2A:
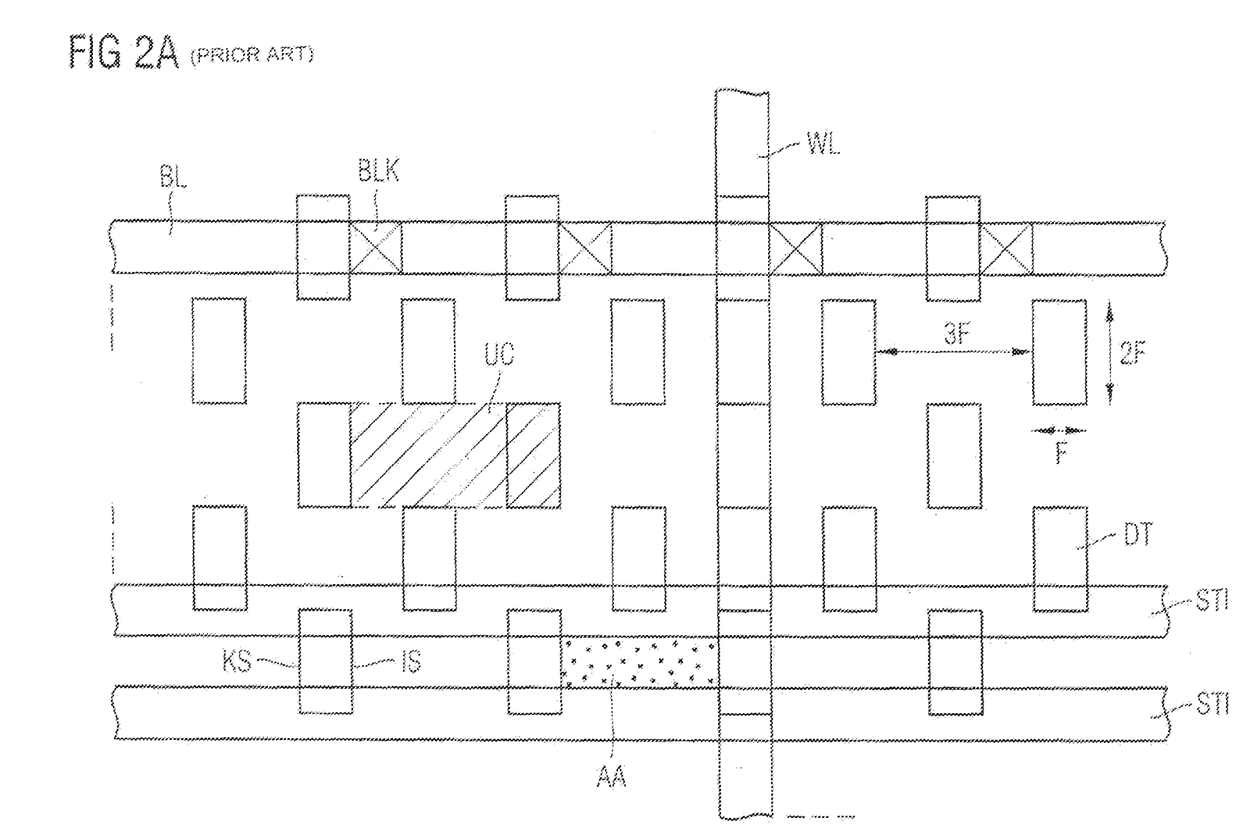
FIG. 2A, B show a respective view from above onto a memory cell field having memory cells according to FIG. 1 in a first and second arrangement possibility.
Figure 2B:
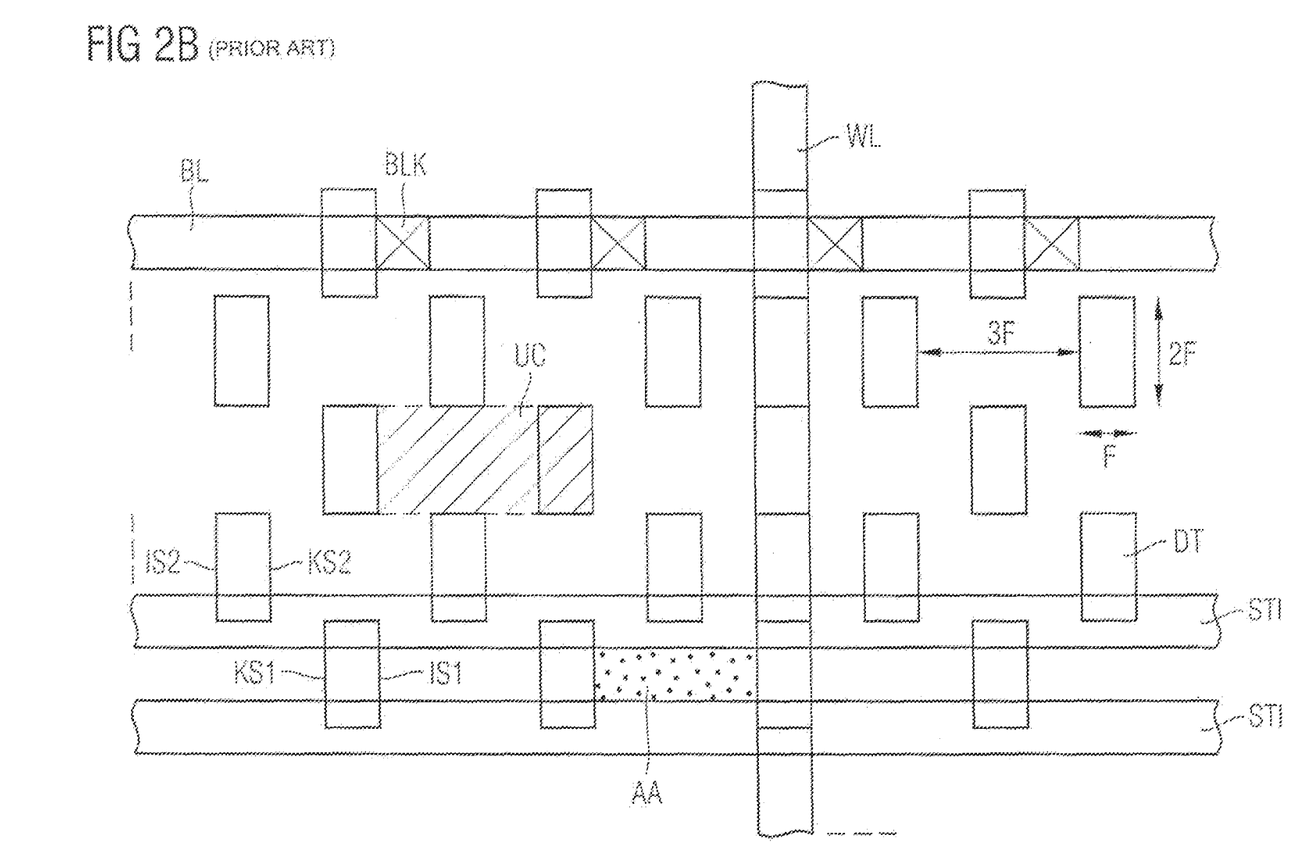

In the medium and upper region of the trenches G1, G2, surrounding isolation collars 10a, 10b are provided, above which buried contacts 15a, 15b are provided which are in electrical contact with said conductive fillings 20a, 20b and the adjoining semiconductor substrate 1. The buried contacts 15a, 15b are connected to the semiconductor substrate on a single side only (cmp. FIG. 2a,b). Isolation regions 16a, 16b isolate the other substrate side with respect to the buried contacts 15a, 15b and isolate the buried contacts 15a, 15b to the top of the trenches G1, G2.

This arrangement allows a very high packing density of the trench capacitors GK1, GK2 and the associated selection transistors which will be explained in the following. In this respect, the selection transistor associated to the trench capacitor GK2 will be mainly referred to, because only the drain region D1 and the source region S3, respectively, of the neighbor selection transistors are depicted. The selection transistor associated to trench capacitor GK2 comprises a source region S2, a channel region K2 and a drain region D2. The source region S2 is connected to a (not shown) bit line arranged above an isolation layer I via a bit line contact BLK. The drain region D2 is connected to said buried contact 15b on a single side. Above the channel region K2, a word line WL2 is located which comprises a gate stack GS2 and a surrounding gate isolator GI2. The word line WL2 is an active word line for the selection transistor of the trench capacitor GK2.

Word lines WL1 comprising gate stack GS1 and gate isolator GI1 and word line WL3 comprising gate stack GS3 and gate isolator GI3 are running in parallel to the word line WL2, word lines WL1 and WL3 being passive word lines for the selection transistor of the trench capacitor GK2. The word lines WL1, WL3 are adapted for controlling selection transistors which are shifted in the third dimension with respect to said cross-section.

It may be obtained from FIG. 1 that this kind of single-sided connection of the buried contact allows a direct arrangement of the trenches and the neighboring source regions or drain regions of the associated selection transistors next to each other. Thus, the length of a memory cell can amount to only 4 F, and the width can amount to only 2 F, F being the minimum length unit which may be realized in a technological respect (cmp. FIG. 2a, 2b).

FIG. 2A shows a view from above onto a memory cell field having memory cells according FIG. 1 in a first arrangement possibility.

Reference sign DT in FIG. 2A denotes trenches which are arranged in rows having a distance of 3 F and in columns having a distance of 2 F to each other. Neighboring rows are shifted by 2 F with respect to each other. UC in FIG. 2A denotes the area of the unit cell which amounts to 4 F×2 F=8 $F^2$. STI denotes isolation trenches which are arranged in row direction in a distance of 1 F to each other and which isolate neighboring active regions from each other. Also, with a distance of 1 F to each other, bit lines BL are arranged in row direction, whereas said word lines in column direction have a distance of 1 F to each other. In this arrangement example, all trenches DT have a contact region KS of the buried contact to the substrate on the left side and an isolation region IS on the right side (regions 15a,b and 16a,b, respectively, in FIG. 1).

FIG. 2B shows a view from above onto a memory cell field having memory cells according to FIG. 1 in a second arrangement possibility.

In this second arrangement possibility, the rows of the trenches have alternating connection regions or isolation regions of the buried contacts. Thus, in the lowest row of FIG. 2B, the buried contacts have on the left side a contact region KS1 and on the right side a isolation region IS1. On the other hand, in the row laying above, all trenches DT have an isolation region IS2 on the left side and a contact region KS2 on the right side. This arrangement alternates in column direction.

For DRAM memory devices having trench capacitors in sub-100 nm technologies, the resistance of the trench and the buried contact make up a main contribution to the total RC delay and determine the speed of the DRAM. Caused by the relatively low conductivity and the pinch-off which is produced by an overlay displacement of the STI etch, the series resistance in the trench is enhanced dramatically.

This problem was diminished by the introduction of polysilicon highly doped with arsenic, an improvement of the overlay between the active regions and the trench, the introduction of a self-aligned manufacture of a buried contact with single-sided connection, and a thinning of the nitride contact region of the buried contact. Particularly, the upper region of the polysilicon filling highly doped with arsenic in the trench constitutes a big problem for the sub-100 nm technologies, because the doping level cannot be further enhanced and the diameter is influenced by the STI trench formation (STI=Shallow Trench Isolation).

SUMMARY OF THE INVENTION

The present invention relates to a manufacturing method for a trench capacitor having an isolation collar which is electrically connected with a substrate on a single side via a buried contact, particularly for use in a semiconductor memory cell. More specifically, the present invention relates to a manufacturing method for a trench capacitor having an isolation collar with a metal conductive fill in the collar region connected to a metal fill in the capacitor region.

The present invention provides an improved manufacturing method for a single-sided connected trench capacitor having lower RC delay.

The present invention provides a process where metal regions having low resistance are provided in the lower and upper trench region.

According to a preferred embodiment, the metallic region is a second metallic liner and a third conductive filling is provided within the second metallic liner which is etched-back to the upper side of the etched-back second metallic liner.

According to another preferred embodiment, the metallic region is a metallic filling.

According to another preferred embodiment, after partly removing the second conductive filling, an isolation filling is provided in the upper trench region at least up to the upper side of the substrate.

According to another preferred embodiment, the isolation filling is provided in an STI trench forming process.

According to another preferred embodiment, the first metallic liner and the second metallic region are made of one of the following materials: TiN, TaN, HfN, W, HfAlN, C.

According to another preferred embodiment, the first conductive filling and the second conductive filling are made of polysilicon.

According to another preferred embodiment, the third conductive filling is made of polysilicon.

BRIEF DESCRIPTION OF THE DRAWINGS

Preferred embodiments of the invention are depicted in the drawings and explained in the following description.

In the Figures.

In the Figures, identical reference signs denote equivalent or functionally equivalent components.

DETAILED DESCRIPTION OF THE INVENTION

In the embodiments described below, an explanation of the manufacture of the planar selection transistors is omitted for the sake of clarity, and only the formation of the single-sided connected buried contact of the trench capacitor is explained in detail. The steps of manufacturing the planar selection transistors are the same as known from the state of the art, except it is explicitly described differently.

FIGS. 3A-G are schematic drawings of subsequent method steps of a manufacturing method as a first embodiment of the present invention.

Figure 3A:
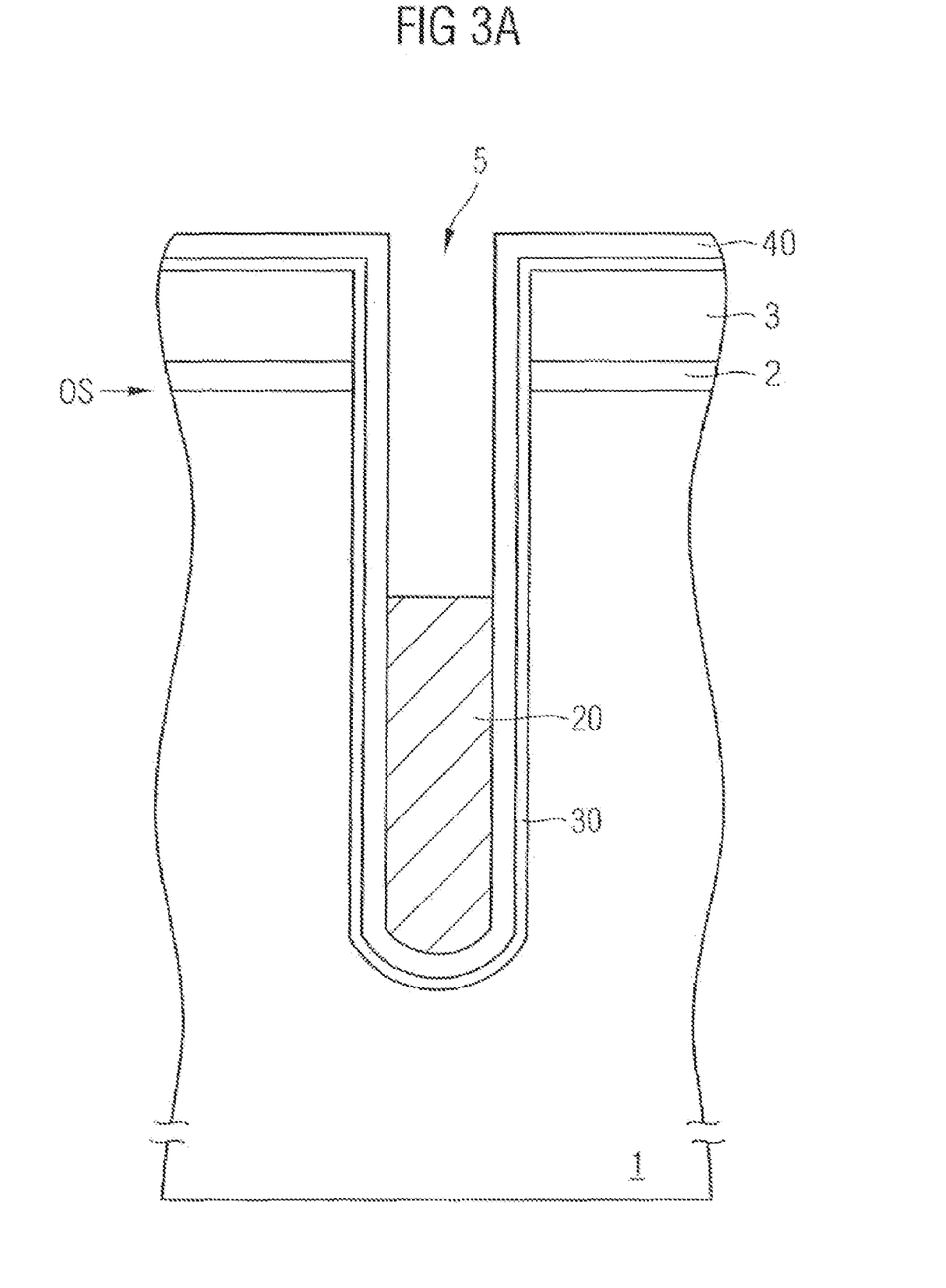
FIGS. 3A-G are schematic drawings of subsequent method steps of a manufacturing method as a first embodiment of the present invention.

In FIG. 3A, reference sign 5 denotes a trench which is provided in a silicon semiconductor substrate 1. On the upper side OS of the semiconductor substrate 1, there is a hard mask consisting of a padoxide layer 2 and a padnitride layer 3. A dielectric layer 30 is provided in the trench which isolates an electrically conductive filling 20 with respect to the surrounding semiconductor substrate 1. After providing the dielectric layer 30, a first metal liner layer 40 is deposited over the structure. In this example, the first metal liner layer 40 is made of TiN. Thereafter, a doped polysilicon filling 20 is provided in the trench 5 by depositing and back-etching polysilicon. The filling 20 fills about the lower half of the trench 5, as schematically shown in FIG. 3A.

According to FIG. 3B, the dielectric layer 30 and the first metal liner layer 40 are etched back below the upper surface of the conductive filling 20. This etching is performed by two different etching steps which are selective with respect to the conductive filling 20. In particular, the metal liner layer 40 is etched back in $NH_4OH/H_2O_2$ solution which is selective with respect to polysilicon and silicon oxide.

Figure 3B:
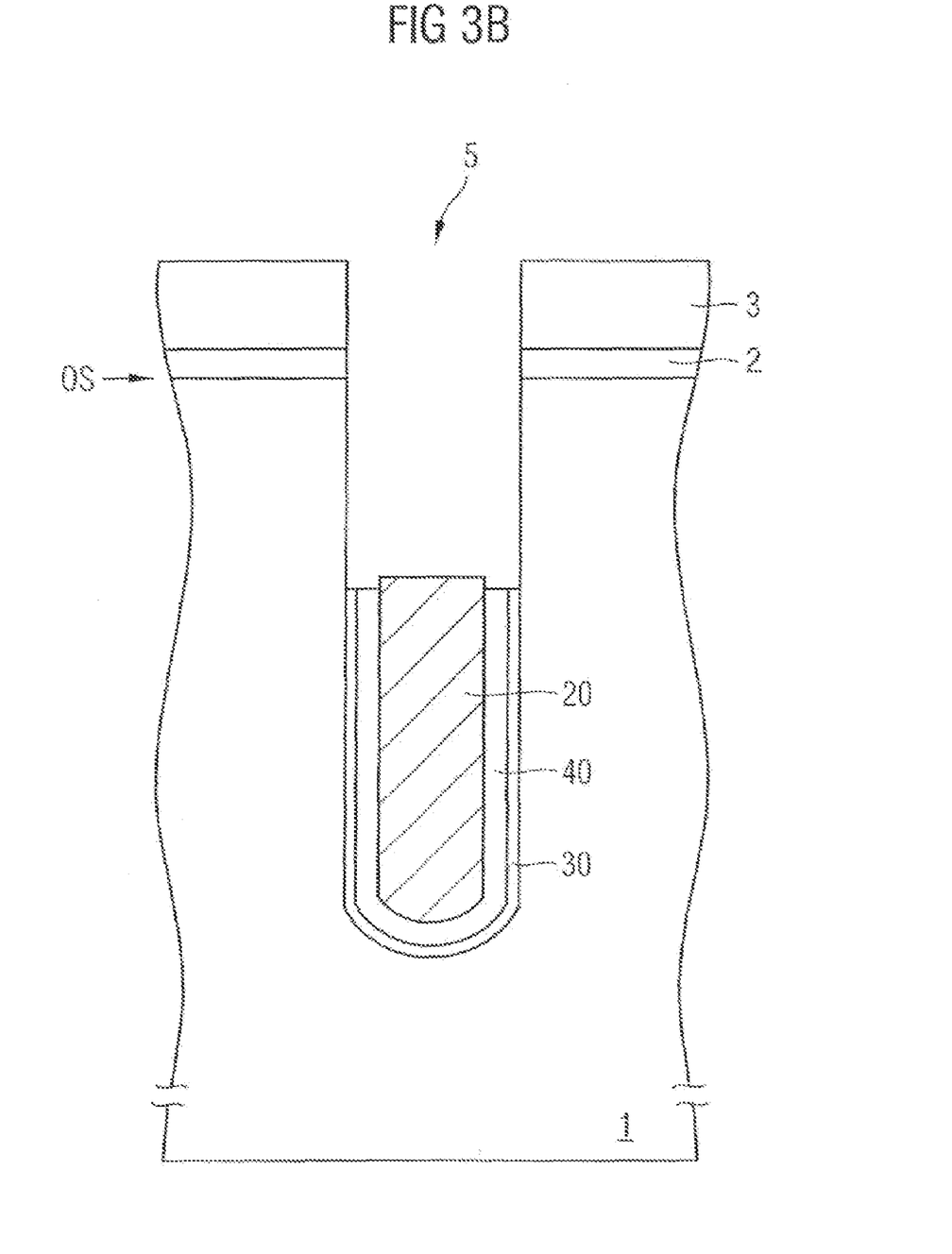
Figure 3C:
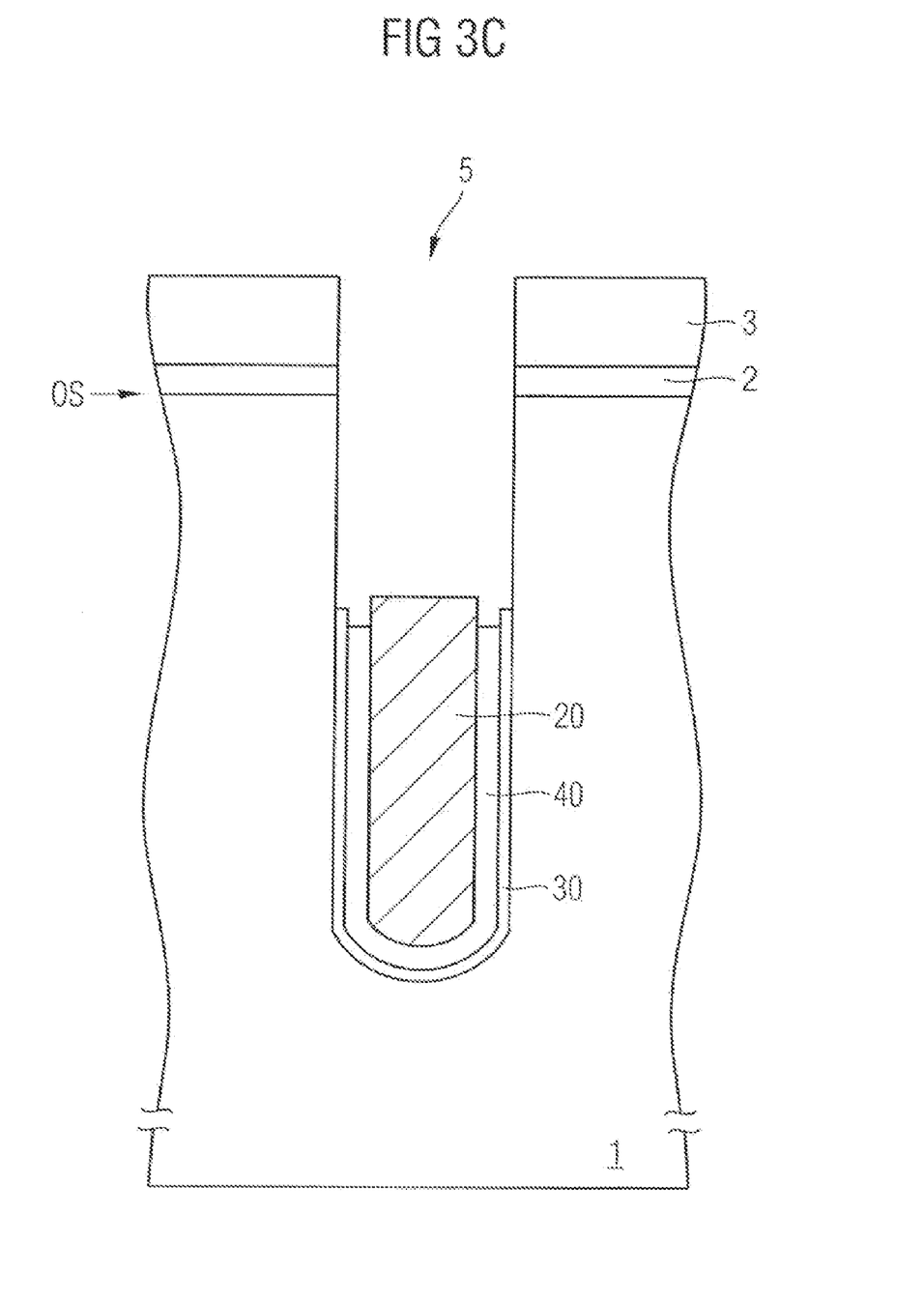

In the next step, as shown in FIG. 3C, the first metal liner layer 40 is further etched back below the dielectric layer 30 in order to prevent later electrical short circuits.

Figure 3D:
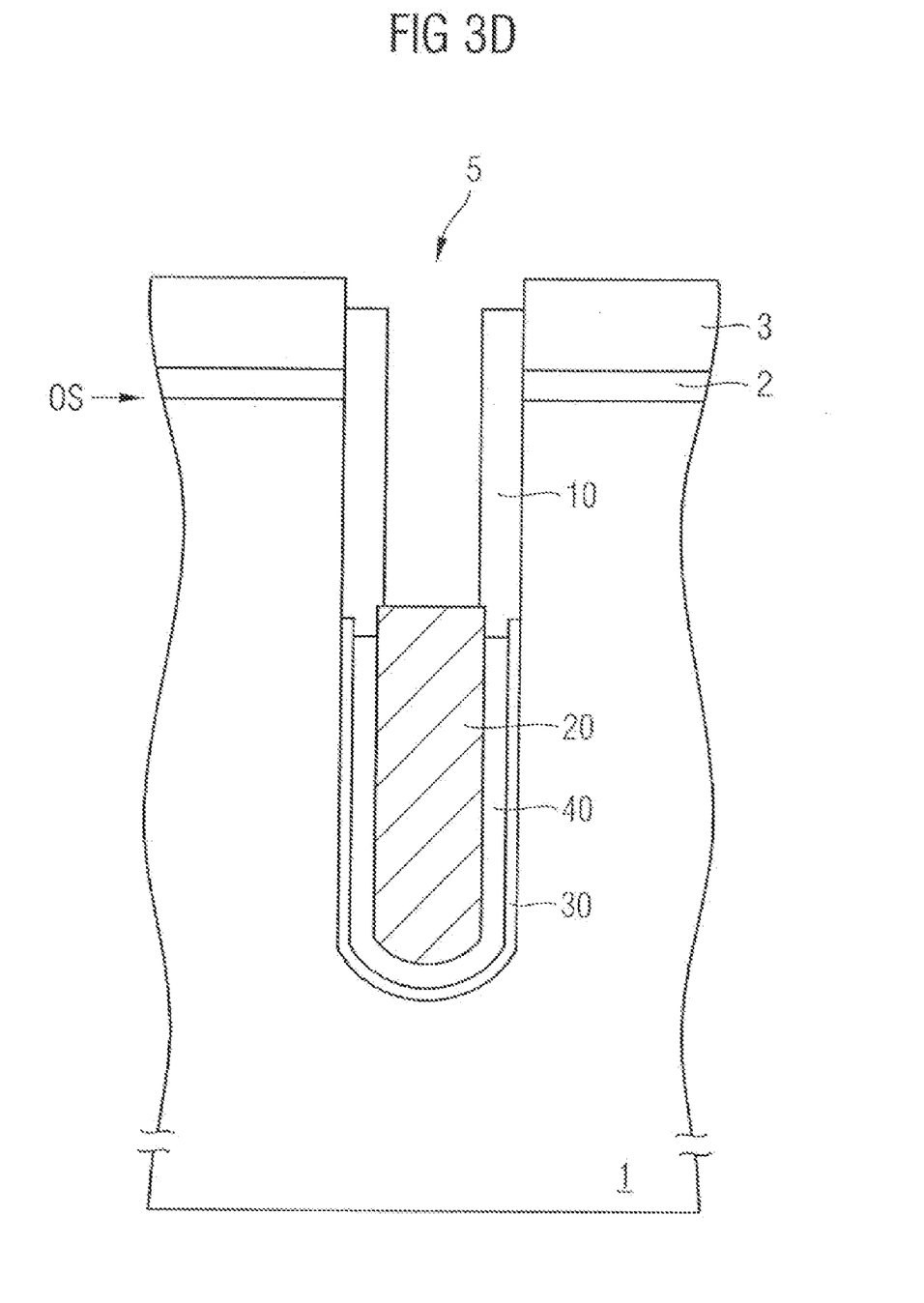

In the next step which is shown in FIG. 3D, an isolation collar 10 may be of silicon dioxide and is provided in the upper half of the trench 5 above the dielectric layer 30, the first metal liner layer 40 and the conductive filling 20. The width extension of the isolation collar 10 is such that it fully covers the dielectric layer 30, the first metal liner layer 40 and partly covers the conductive filling 20 of polysilicon.

Figure 3E:
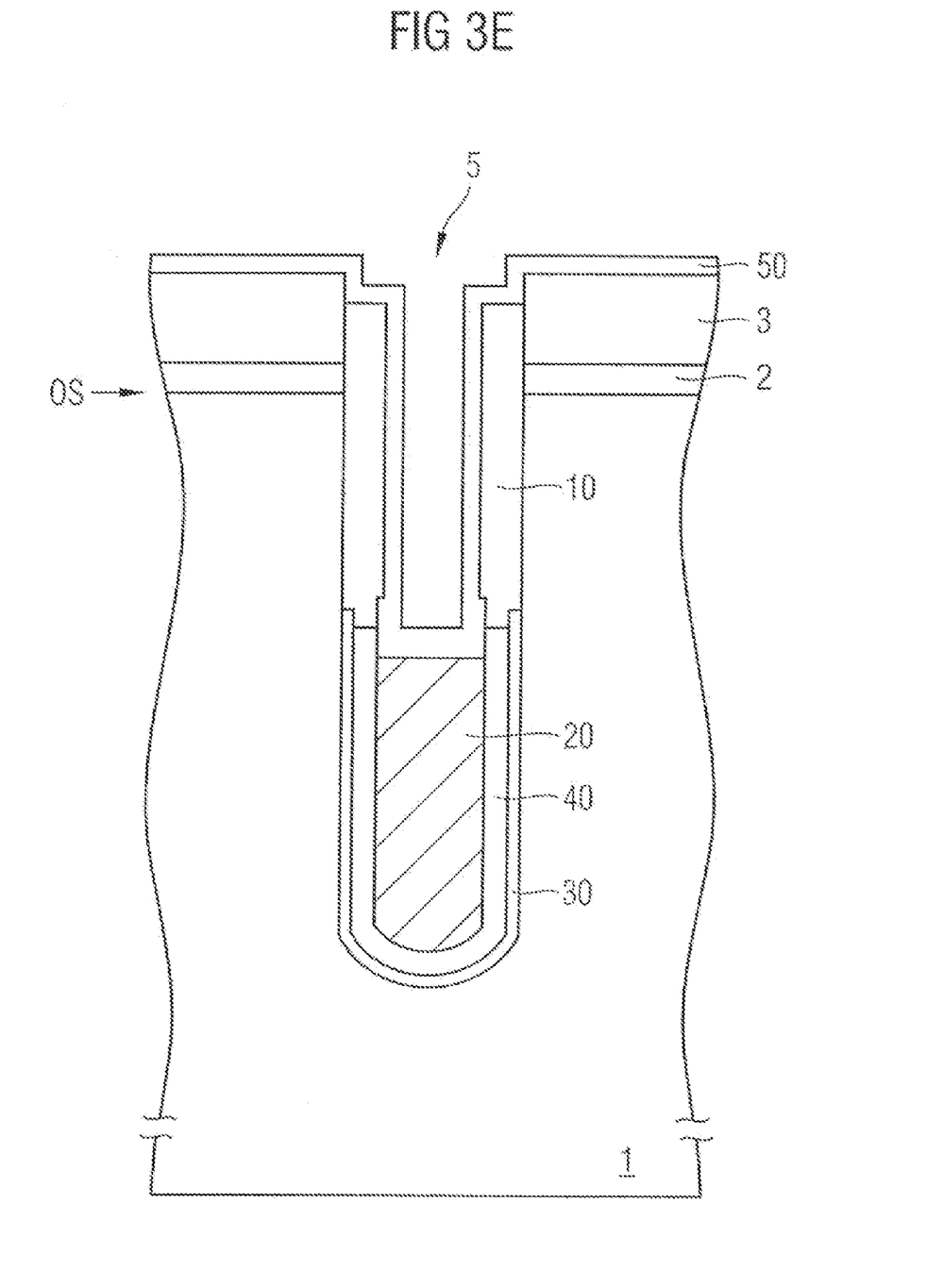

In a subsequent process step which is illustrated in FIG. 3E, the conductive filling 20 of polysilicon is etched back below the upper side of the first metal liner layer 40. Then, a second metal liner layer 50 made of TiN is deposited over the resulting structure. It should be noted that the second metal liner layer 50 of TiN is in electrical contact with the first metal liner layer 40.

Figure 3F:
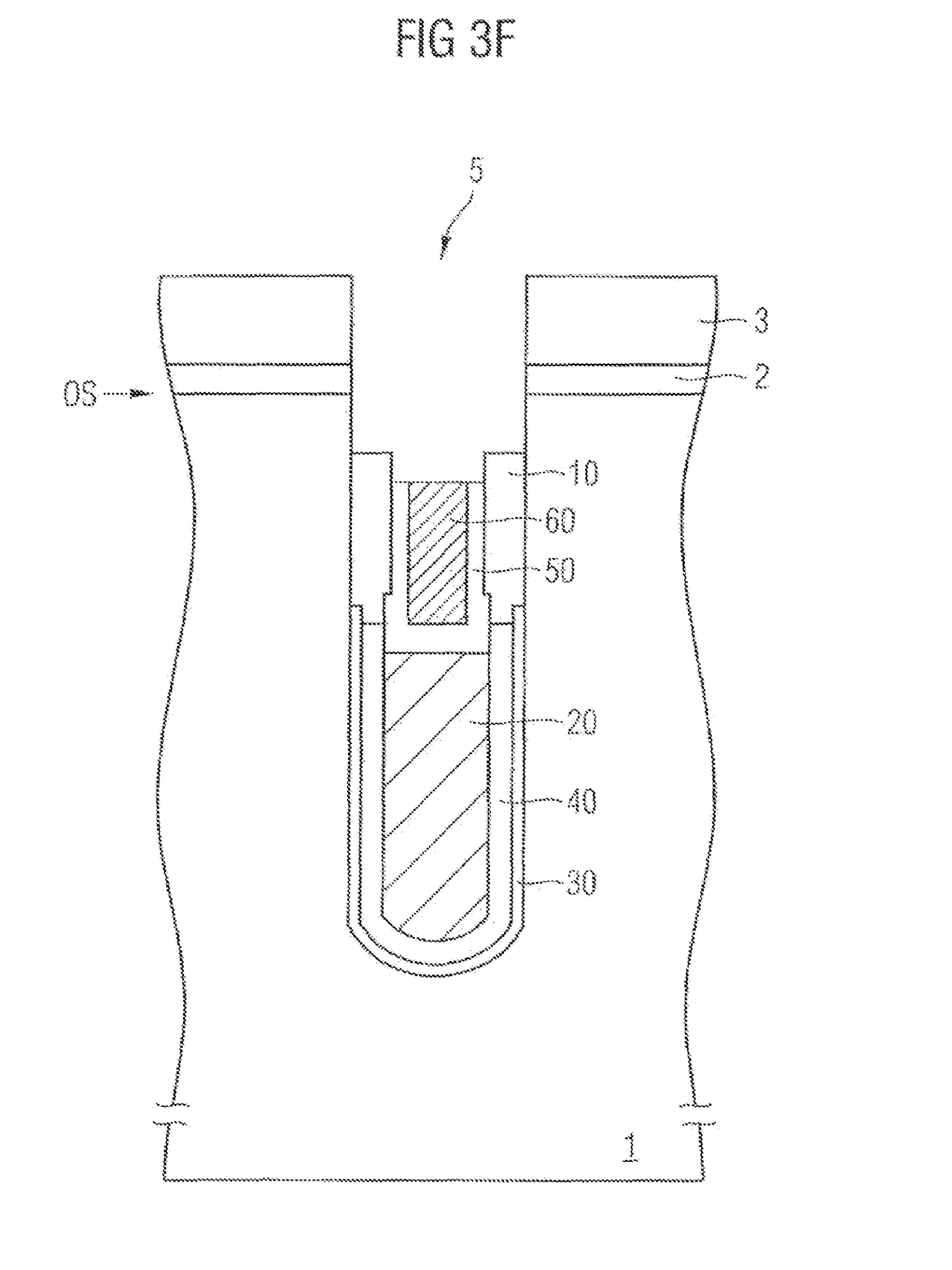

Subsequently, as depicted in FIG. 3F, a second conductive filling 60 of silicon is provided which completely fills the trench within the second metal liner layer 50. Thereafter, the second metal liner layer 50 and the second conductive filling 60 are etched back below the upper side or else of the substrate, and then also the isolation collar 10 is etched back below the upper side or else of the substrate 1.

In particular, the second metal line layer 50 is etched back in $NH_4OH/H_2O_2$ solution which is selective with respect to polysilicon and silicon oxide.

As a result, the upper side of the second metal liner layer 50 and the second conductive filling 60 is below the upper side of the etched-back isolation collar 10.

Figure 3G:
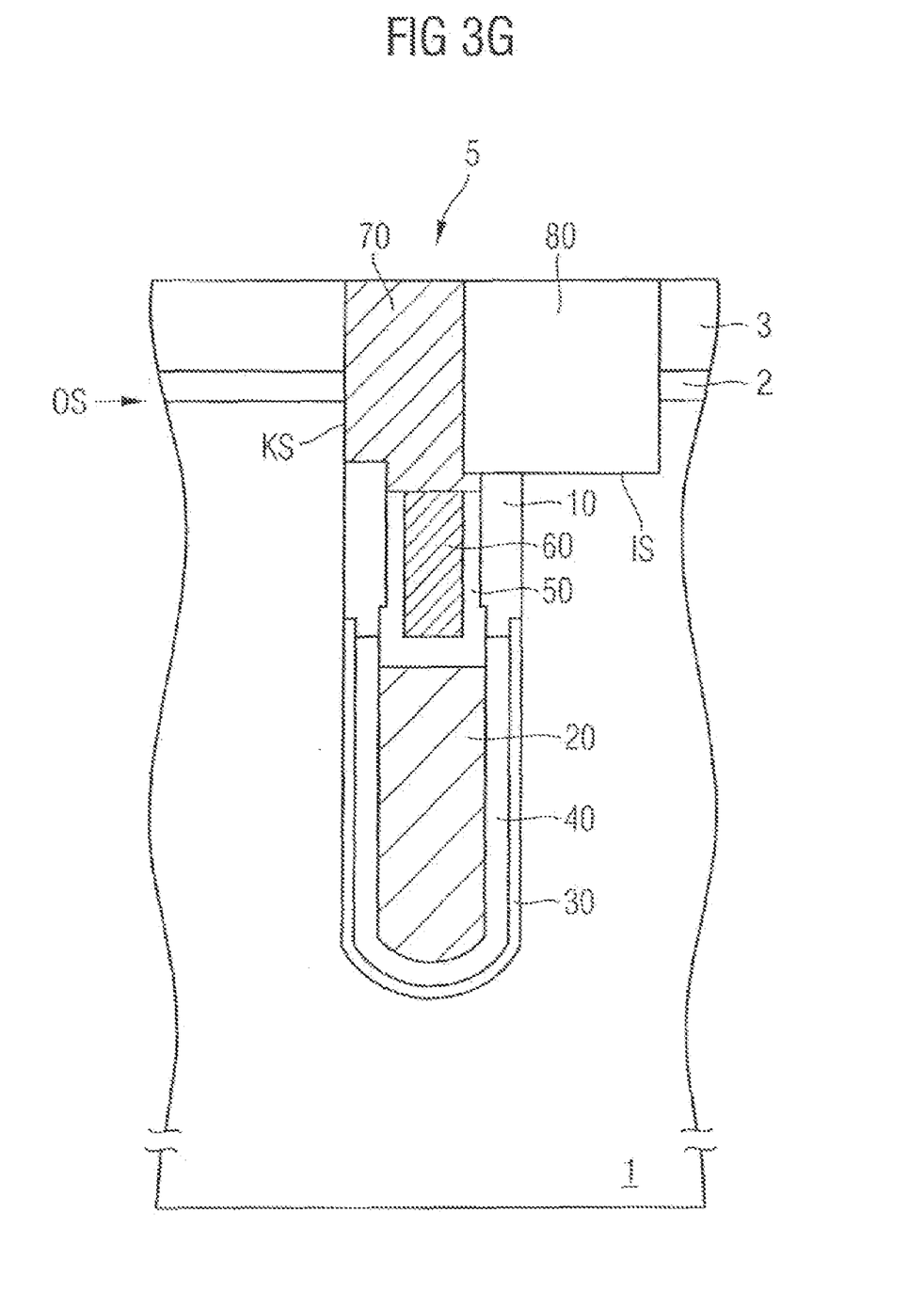

In FIG. 3G, it is shown that starting from the process state of FIG. 3, the trench is completely filled with a third conductive filling 70 of polysilicon which is polished back down to the surface of the pad nitride layer 3. In order to provide a single-sided buried contact having a contact region KS only on a single side, a part of the third conductive filling 70 is removed and replaced by an isolation filling 80. In this example, this isolation filling 80 is provided in an STI trench process. In the region where the third conductive filling 70 has been removed, the isolation filling 80 which in this example is made of silicon oxide provides an isolation region of the capacitor contact with respect to the substrate 1.

As may be obtained from FIG. 3g, the major part of the inner capacitor electrode is formed of the first and second metal liner layer 40, 50, and therefore it is possible to reduce the RC delay of this trench capacitor dramatically in comparison to prior art solutions where the inner capacity electrode is made of polysilicon only.

Figure 4A:
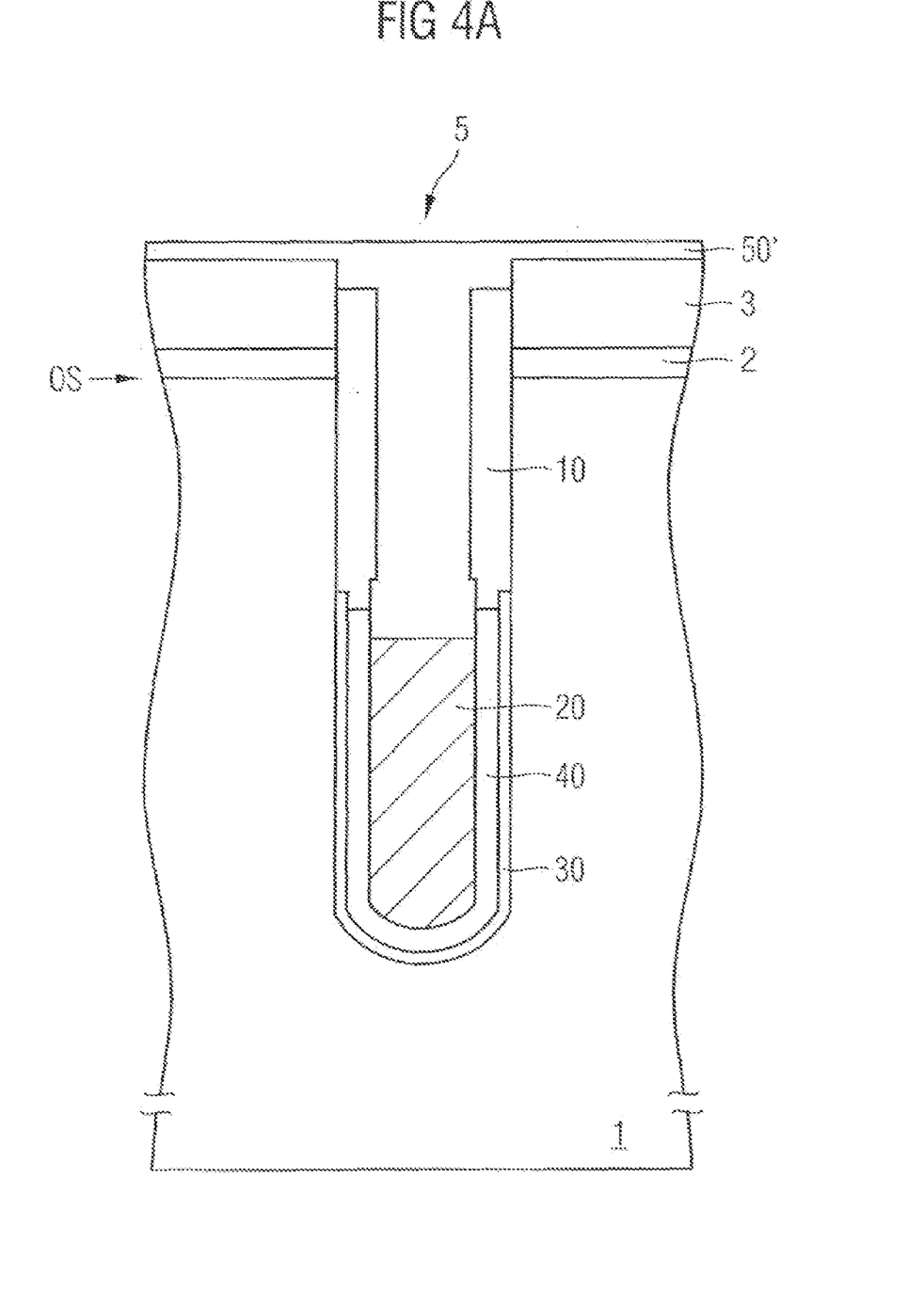
FIGS. 4A-C are schematic drawings of subsequent method steps of a manufacturing method as second embodiment of the present invention.
Figure 4B:
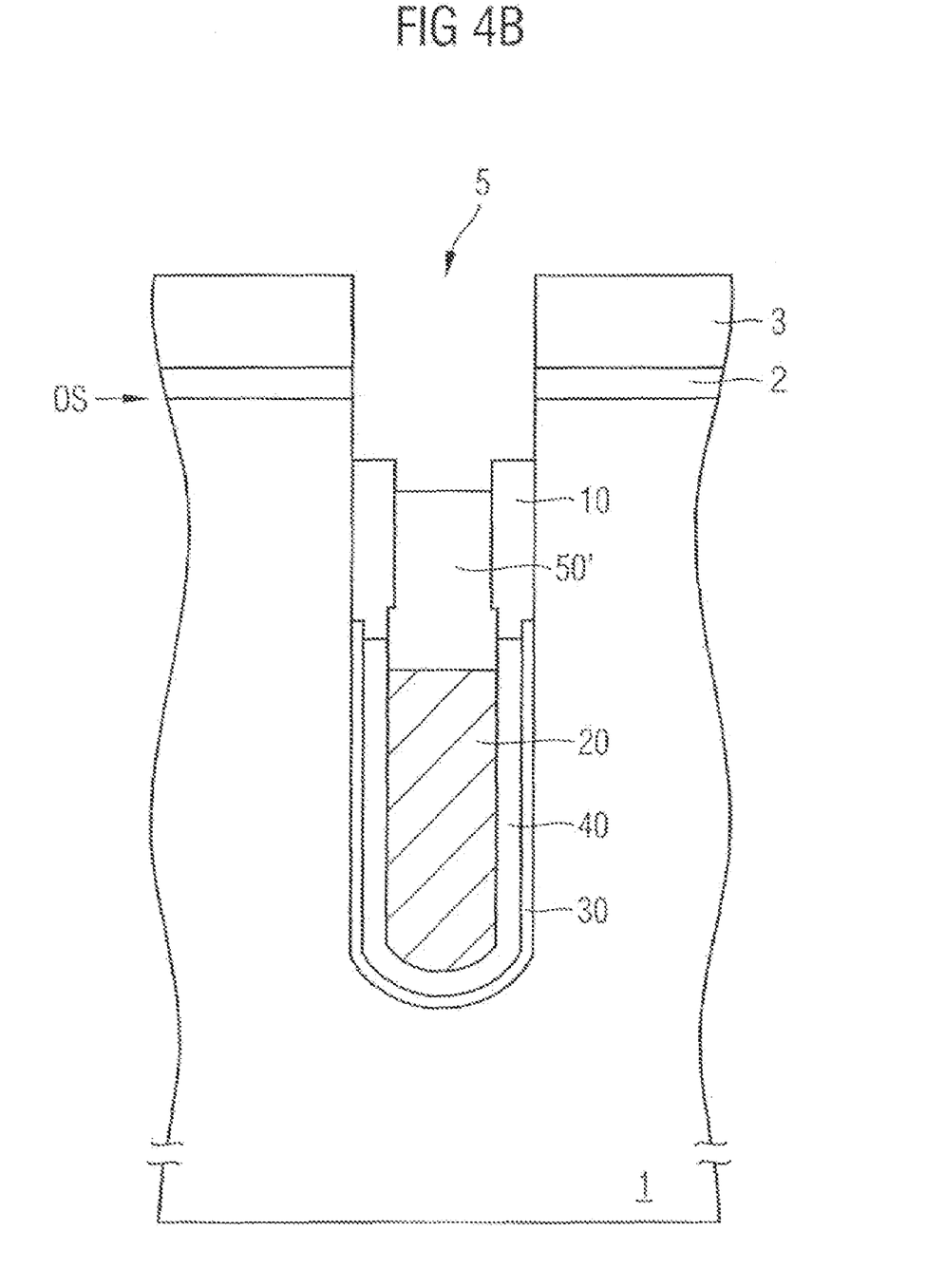
Figure 4C:
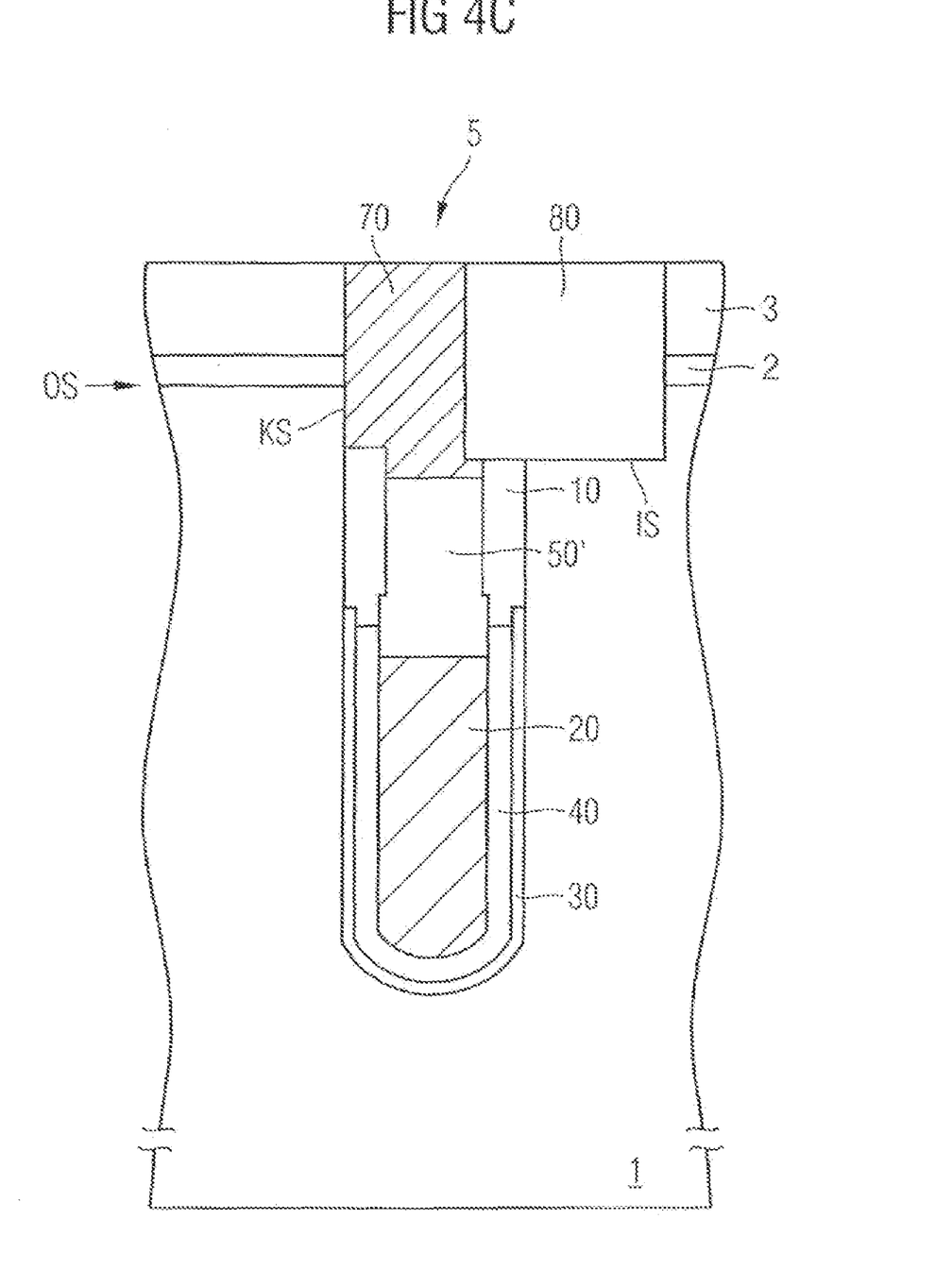

FIGS. 4A-C are schematic drawings of subsequent process steps of the manufacturing method as second embodiment of the present invention.

The starting point of FIG. 4A follows the process status of FIG. 3B of the above described first embodiment.

Instead of depositing a second metal liner layer 50, the second embodiment is characterized by a complete metal fill 50' of the trench, said metal fill 50' being made of TiN as well.

Further, as shown in FIG. 4B, the metal filling 50' is etched below the upper side OS of the substrate 1, and thereafter the isolation collar 10 is also etched below the upper side OS of the substrate 1 such that the upper side of the etched-back metal filling 50' is below the upper side of the etched-back isolation collar 10. In particular, the metal filling 50' is etched back in $NH_4OH/H_2O_2$ solution which is selective with respect to polysilicon and silicon oxide.

Finally, as shown in FIG. 4C, the third conductive filling 70 made of polysilicon is provided in the trench in order to establish the contact region KS to the surrounding substrate 1. Then, a part of the third conductive filling 70 is removed and replaced by the isolation filling 80 made of silicon dioxide in order to provide the isolation region IS.

Also in this embodiment, the major part of the inner capacitor electrode is made of the first metal liner layer 40 and the metal filling 50' which are made of TiN. Thus, the RC delay of the trench capacitor according to this embodiment is also remarkably lowered in comparison to the prior art.

Although the present invention has been described with respect to two preferred embodiments, it is not limited thereto, but can be modified in various manners which are obvious for the person skilled in the art.

Particularly, the selection of the materials is only an example and can be varied variously.

What is claimed is:

1. A manufacturing method for a trench capacitor having an isolation collar in a substrate which is electrically connected to a substrate on a single side via a buried contact for use in a semiconductor cell having a planar selection transistor provided in the substrate and connected via the buried contact, comprising:
   providing a trench in the substrate using a hard mask having a corresponding mask opening;
   providing a capacitor dielectric in the trench on the trench wall;
   providing a first metallic liner on the capacitor dielectric in the trench on the trench wall;
   providing a first conductive filling in the trench and etching back the conductive filling within the trench;
   etching back the capacitor dielectric and the first metallic liner within the trench to at least the upper surface of the etched-back first conductive filling;
   providing an isolation collar in the trench above the capacitor dielectric, above the first metallic liner and above the etched-back first conductive filling;
   etching back the first conductive filling within the trench to below the lower side of the isolation collar;
   providing a metallic region within the trench in electrical contact with the first metallic liner and etching back the metallic region within the trench to below the upper side of the isolation collar;
   etching back the isolation collar to below the upper side of the substrate and to above the upper side of the etched-back metallic region; and
   providing a single-sided isolation region and a single-sided contact region to the substrate by partly removing a second conductive filling in electrical contact with the etched-back metallic region.

2. The method according to claim 1, wherein the metallic region is a second metallic liner and wherein a third conductive filling is provided within the second metallic liner which is etched-back to the upper side of the etched-back second metallic liner.

3. The method according to claim 1, wherein the metallic region is a metallic filling.

4. The method according to claim 1, wherein after partly removing the second conductive filling an isolation filling is provided in the upper trench region at least up to the upper side of the substrate to form the single-sided isolation region.

5. The method according to claim 4, wherein the isolation filling is provided in an shallow trench isolation forming process.

6. The method according to claim 1, wherein the first metallic liner and the second metallic region are made of one of the following materials: TiN, TaN, HfN, W, HfAlN, C.

7. The method according to claim 1, wherein the first conductive filling and the second conductive filling are made of polysilicon.

8. The method according to claim 2, wherein the third conductive filling is made of polysilicon.

9. A method of forming a trench capacitor, comprising:
   forming a trench in a substrate;
   providing a capacitor dielectric in the trench on a trench wall thereof;
   providing a first conductive liner on the capacitor dielectric in the trench on the trench wall;
   filling a bottom portion of the trench with a first conductive filling, the first conductive filling having an upper surface;
   removing a portion of the capacitor dielectric and the first conductive liner within the trench to at least the upper surface of the first conductive filling;
   providing an isolation collar in the trench above the capacitor dielectric, above the first conductive liner, and above the first conductive filling, the isolation collar having a lower side;
   removing a portion of the first conductive filling within the trench to below the lower side of the isolation collar;
   providing a conductive region within the trench in electrical contact with the first conductive liner, wherein an upper surface of the conductive region is below an upper side of the isolation collar;
   removing a portion of the upper side of the isolation collar such that a remaining upper side of the isolation collar is below a surface of the substrate and above the upper surface of the conductive region;
   forming an isolation region over a portion of the isolation collar on a side portion of the trench; and
   forming a single-sided contact region in the trench adjacent to the isolation region.

10. The method of claim 9, wherein the first conductive liner comprises a metallic liner.

11. The method of claim 10, wherein the conductive region comprises a second metallic liner.

12. The method of claim 11, wherein the first metallic liner and the second metallic liner comprise one of the following materials: TiN, TaN, HfN, W, HfAlN, C.

13. The method of claim 9, wherein the single-sided contact region comprises polysilicon.

* * * * *